United States Patent
Je et al.

(10) Patent No.: US 8,613,287 B2
(45) Date of Patent: Dec. 24, 2013

(54) APPARATUS FOR PREVENTING STICTION OF MEMS MICROSTRUCTURE

(75) Inventors: Chang Han Je, Daejeon (KR); Myung Lae Lee, Daejeon (KR); Sung Hae Jung, Daegu (KR); Gunn Hwang, Seoul (KR); Chang Auck Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 952 days.

(21) Appl. No.: 12/672,993

(22) PCT Filed: Apr. 14, 2008

(86) PCT No.: PCT/KR2008/002091
§ 371 (c)(1),
(2), (4) Date: Feb. 10, 2010

(87) PCT Pub. No.: WO2009/025435
PCT Pub. Date: Feb. 26, 2009

(65) Prior Publication Data
US 2011/0186089 A1  Aug. 4, 2011

(30) Foreign Application Priority Data
Aug. 17, 2007 (KR) .......... 10-2007-0082558

(51) Int. Cl.
*B08B 3/00* (2006.01)
(52) U.S. Cl.
USPC ............ 134/105; 134/42; 134/902; 134/26; 134/2; 977/701; 977/724; 977/847; 257/E21.228; 257/E21.251; 257/419; 438/53; 438/689; 438/745

(58) Field of Classification Search
USPC .......... 134/105, 42, 902, 26, 2, 3; 977/701, 977/724, 847; 257/E21.228, E21.251, 257/E21.252, 419; 438/53, 689, 745, 906; 510/175, 176
See application file for complete search history.

(56) References Cited

U.S. PATENT DOCUMENTS

| 6,229,684 | B1 | 5/2001 | Cowen et al. |
| 6,395,574 | B2 | 5/2002 | Benzel et al. |
| 6,562,146 | B1 | 5/2003 | DeYoung et al. |
| 6,806,205 | B2 * | 10/2004 | Jang et al. ............... 438/745 |
| 2003/0008506 | A1 * | 1/2003 | Cho et al. ............... 438/689 |
| 2003/0164041 | A1 * | 9/2003 | Jeong et al. ............ 73/504.08 |

FOREIGN PATENT DOCUMENTS

| JP | 2006-108402 A | 4/2006 |
| KR | 10-0170952 B1 | 10/1998 |

OTHER PUBLICATIONS

Pornsin-Sirirak et al., Jan. 2001, California Institute of Technology Electrical Engineering Department, pp. 511-514.*
Pornsin-Sirirak et al., "Flexible parylene actuator for micro adaptive flow control", Jan. 2001, California Institute of Technology Electrical Engineering Department, pp. 511-514.*

(Continued)

Primary Examiner — Michael Barr
Assistant Examiner — Thomas Bucci

(57) ABSTRACT

An apparatus for preventing stiction of a three-dimensional MEMS (microelectromechanical system) microstructure, the apparatus including: a substrate; and a plurality of micro projections formed on a top surface of the substrate with a predetermined height in such a way that a cleaning solution flowing out from the microstructure disposed thereabove is discharged.

9 Claims, 6 Drawing Sheets

(56) References Cited

OTHER PUBLICATIONS

T.N. Pornsin-Sirirak et al., "Flexible Parylene Actuator for Micro Adaptive Flow Control," 14th OEEE International MEMS Conference 2001, Jan. 2001, pp. 511-514, IEEE.

Jong Hyun Lee et al., "Gas-Phase Etching of Sacrificial Oxides using Anhydrous HF and $CH_3OH$," 1997, pp. 448-453, IEEE.

Norio Fujitsuka et al., "A New Processing Technique to Prevent Stiction using Silicon Selective Etching for SOI-MEMS," Sensors and Actuators A 97-98 (2002), 2002, pp. 716-719, 2002 Elsevier Science B.V.

International Search Report for PCT/KR2008/002091 filed on Apr. 14, 2008.

Written Opinion of the International Searching Authority for PCT/KR2008/002091 filed on Apr. 14, 2008.

* cited by examiner (a)

(b)

APPARATUS FOR PREVENTING STICTION OF MEMS MICROSTRUCTURE

TECHNICAL FIELD

The present invention relates to an apparatus for preventing a microelectromechanical system (MEMS) device including a three-dimensional MEMS microstructure from sticking to a substrate, and more particularly, to an apparatus for preventing stiction of a three-dimensional MEMS microstructure, the apparatus capable of reducing surface tension of a cleaning solution by using a simple apparatus to prevent a phenomenon in which the microstructure sticks to a substrate due to surface tension occurring when removing a cleaning solution existing between the microstructure and the substrate.

The present invention was partly supported by IT R&D program of MIC/IITA [2006-S-054-02, Development of CMOS based MEMS processed multi-functional sensor for ubiquitous environment]

BACKGROUND ART

MEMS is an aberration of microelectromechanical system. That is, MEMS indicates technology of manufacturing electromechanical systems on one chip by manufacturing and mounting micro mechanical components, sensors, actuators, and electronic components on a semiconductor wafer substrate by using semiconductor process and micromachining technologies. Such three-dimensional MEMS microstructure is essentially included in various micro systems such as accelerator sensors and micro switches. To mechanically drive or sense by using the three-dimensional MEMS microstructure, it is required to manufacture the microstructure floated leaving a certain space from a substrate to freely move.

As described above, to float the microstructure with the certain space from the substrate, a sacrificial layer is formed between the substrate and the microstructure in manufacturing the three-dimensional MEMS in such a way that the microstructure is separated from the substrate with a predetermined space. The sacrificial layer is selectively removed, thereby floating the microstructure from the substrate.

Generally, as a method of removing a sacrificial layer, there is used wet etching of removing the sacrificial layer by putting a microstructure and a substrate with the sacrificial layer formed therebetween, in an etching solution. When the sacrificial layer is removed by the wet etching, a residual etching solution is cleaned and removed by using a cleaning solution such as deionized water, methanol, and isopropyl alcohol.

However, in the case, while the cleaning solution used to remove the etching solution is vaporized, capillary force occurs due to surface tension of the cleaning solution present between the substrate and the microstructure. Generally, since the capillary force is greater than restitution force of the microstructure, the microstructure sticks to the substrate. The microstructure sticking to the substrate is not separated from the substrate due to electrostatic force and van der Waals forces after the cleaning solution is perfectly vaporized, which is designated as stiction.

As described above, as a method of preventing stiction occurring while removing a cleaning solution, there is supercritical CO2 drying method of replacing a cleaning solution by a carbon dioxide liquid, controlling a temperature and pressure to a supercritical point, and using phase transfer characteristics to a supercritical fluid.

As another method, there is a method of removing a sacrificial layer by using a gaseous etching material. According to this method, instead of wet etching using an existing hydrogen fluoride to remove an oxide sacrificial layer, the oxide sacrificial layer is removed using an anhydrous hydrogen fluoride.

The supercritical CO2 drying method has problems in which a process is complicated, a complicated apparatus is required to form, maintain and control a supercritical state, it is very difficult to manage specimen according to a size thereof, and it is not suitable for mass production.

Also, the method of removing the oxide sacrificial layer in a gaseous state has problems in which a process is complicated, there is a possibility of generating stiction since water is formed while the hydrogen fluoride reacts as an oxide, and it is limited to the case of an oxide sacrificial layer.

DISCLOSURE OF INVENTION

Technical Problem

An aspect of the present invention provides an apparatus for preventing stiction by easily discharging a cleaning solution while removing the cleaning solution after removing a sacrificial layer to float a microstructure.

Technical Solution

According to an aspect of the present invention, there is provided an apparatus for preventing stiction of a three-dimensional MEMS (microelectromechanical system) microstructure, the apparatus including: a substrate; and a plurality of micro projections formed on a top surface of the substrate with a predetermined height in such a way that a cleaning solution flowing out from the microstructure disposed thereabove is discharged.

The plurality of micro projections may have a top portion on which an anti-stiction material is vapor-deposited. The plurality of micro projections may have an uneven top portion.

One or more of fixing walls higher than the plurality of micro projections for preventing a slip of the microstructure may be formed on an edge of the substrate. The apparatus may further include a heating device on a bottom of the substrate. The plurality of micro projections may be symmetrically formed in a shape where a certain pattern is repeated.

According to an aspect of the present invention, there is provided an apparatus for preventing stiction of a three-dimensional MEMS microstructure, the apparatus including: a substrate where an anti-stiction layer is formed on a top thereof and a flow path is formed with a certain depth to discharge a cleaning solution flowing out from the microstructure; and one or more fixing walls formed with a certain height on edge of the substrate to prevent a slip of the microstructure.

The anti-stiction layer may be formed by vapor-depositing an anti-stiction material. The flow path may be formed in a shape where a certain pattern is repeated.

The apparatus may further include a heating device on a bottom of the substrate.

Advantageous Effects

As described above, the apparatus for preventing stiction of the three-dimensional microstructure may remove a cleaning solution existing between the substrate and the microstructure without the stiction by using a simple device instead of a complicated device.

BEST MODE FOR CARRYING OUT THE INVENTION

Exemplary embodiments of the present invention will now be described in detail with reference to the accompanying drawings. Only, in describing operations of the exemplary embodiments in detail, when it is considered that a detailed description on related well-known functions or constitutions may make essential points of the present invention be unclear, the detailed description will be omitted.

Figure 1:
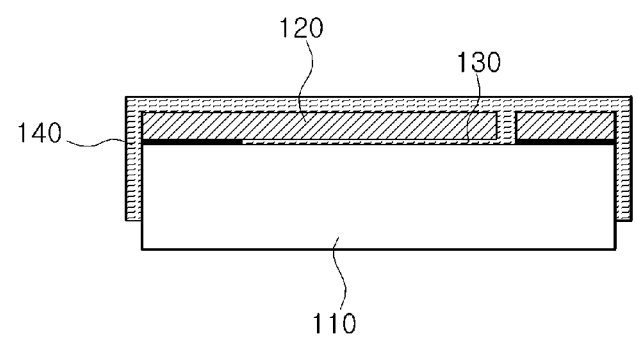
FIG. 1 is diagrams illustrating stiction occurring while drying a cleaning solution in a conventional microstructure.
Figure 1:
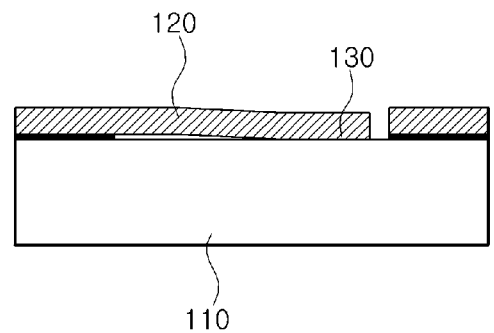

FIG. 1 is diagrams illustrating concepts with respect to a stiction phenomenon occurring while drying a cleaning solution 140 for a conventional microstructure 120.

To float the microstructure 120 from a substrate 110 at the bottom of the microstructure 120, a sacrificial layer present between the substrate 110 and the microstructure 120 is removed by using an etching solution and the etching solution is quickly vaporized by the cleaning solution 140. The cleaning solution 140 used to remove the etching solution is vaporized using a heating device, thereby floating the microstructure 120.

However, as shown in FIG. 1b, in a process of drying and vaporizing the cleaning solution 140, residual of the cleaning solution 140 is present in a floating gap 130 of several micrometers between the microstructure 120 and the substrate 110. Due to surface tension caused by the residual, the microstructure 120 temporarily sticks to the substrate 110. There occurs a phenomenon in which the sticking microstructure 120 permanently sticks to the substrate 110 due to van der Waals force and hydrogen bridging. A method of removing the phenomenon by using a simple apparatus according to an embodiment of the present invention will be described.

Figure 2:
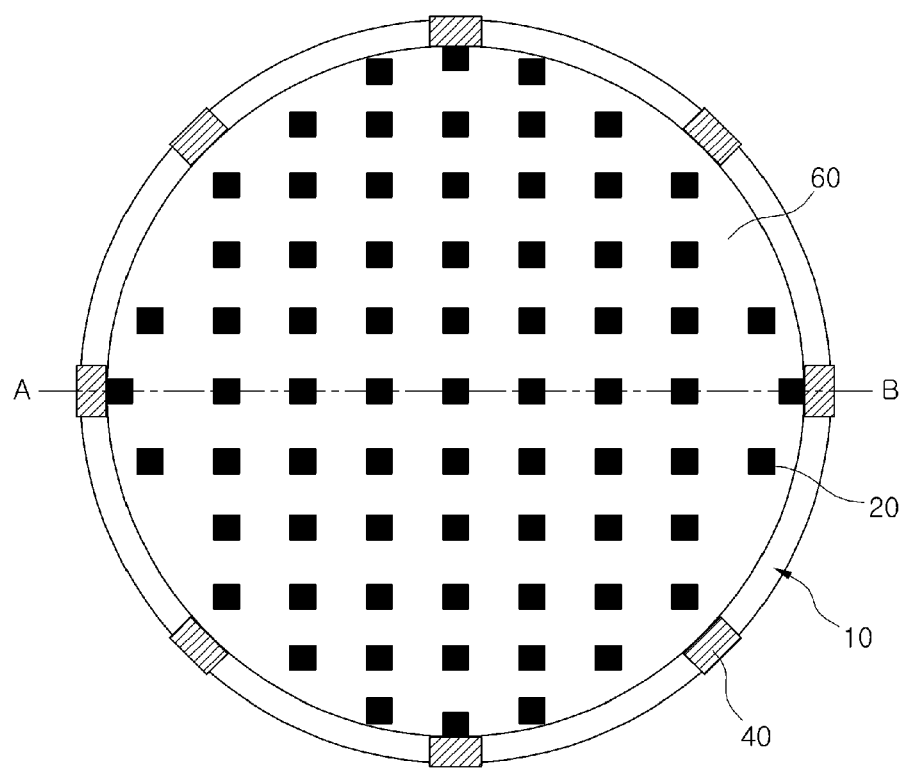
FIG. 2 is a top view illustrating an apparatus for preventing stiction of a three-dimensional microelectromechanical system (MEMS) microstructure, according to an embodiment of the present invention.
Figure 3:
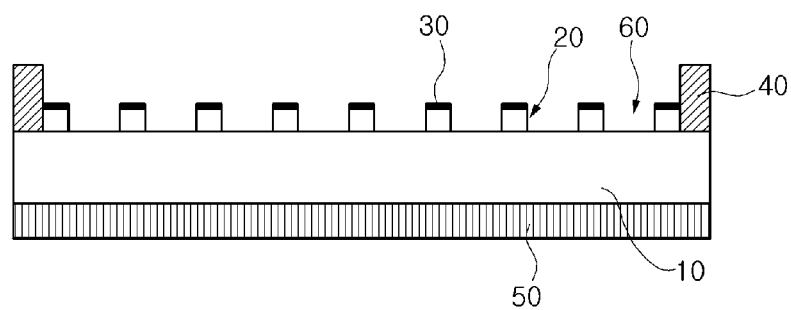
FIG. 3 is a cross-sectional view illustrating the apparatus of FIG. 2 cut along a line A-B in FIG. 2.

FIG. 2 is a top view of an apparatus for preventing stiction of a three-dimensional microelectromechanical (MEMS) microstructure, according to an embodiment of the present invention. FIG. 3 is a cross-sectional diagram illustrating the apparatus of FIG. 2 cut along a line A-B in FIG. 2.

The apparatus includes a substrate 10, a plurality of micro projections 20 formed on the substrate 10, an anti-stiction layer 30 deposited on the plurality of micro projections 30, one or more of fixing walls 40 formed on an edge of the substrate 10 and higher than the plurality of micro projections 20, and a heating device 50 formed on a bottom of the substrate 10.

The substrate 10 may be formed in a circular shape as shown in FIG. 2. However, the substrate 10 may be formed in various shapes according to the shape of the MEMS microstructure. On the top portion of the substrate 10, the plurality of micro projections 20 and the fixing walls 40 are formed with predetermined heights.

The plurality of micro projections 20 may be uniformly formed in a certain pattern on the top surface of the substrate 10. To remove a cleaning solution present between the microstructure (120) and the substrate 110, the microstructure should be disposed on the plurality of micro projections 20. Accordingly, to prevent the microstructure from being inclined by unevenly removing the cleaning solution, the plurality of micro projections 20 may be formed in a shape where a certain pattern is repeated and symmetrical regardless of a direction.

Also, the plurality of micro projections 20 may be formed with a predetermined height in a process of processing the substrate 10 or processing a material deposited on the substrate 10. The height of the plurality of micro projections 20 may be various when a flow path 60 through which the cleaning solution is discharged is capable of being formed. An area of the top surface of the plurality of micro projections 20 may be smaller than that of the microstructure to have surface tension capable of offsetting surface tension occurring between the microstructure and the substrate 110 and to be easily separated after drying the cleaning solution.

On the plurality of micro projections 20, the anti-stiction layer 30 is formed to easily separate the microstructure after drying the cleaning solution. The anti-stiction layer 30 may be formed by vapor-depositing an anti-stiction material or processing the top surface of the plurality of micro projections 20 to be rough to reduce a contact area. As described above, the anti-stiction layer 30 may prevent the microstructure from sticking to the plurality of micro projections 20 and being damaged after removing the cleaning solution.

The plurality of micro projections 20 with the predetermined height is uniformly formed on the top surface of the substrate 10, thereby forming the flow path 60 that is an empty space between the plurality of micro projections 20. The flow path 60 may allow the cleaning solution present between the microstructure and the substrate 110 to be quickly discharged, thereby reducing drying time and preventing a residual cleaning solution.

On the edge of the substrate 10, one or more of the fixing walls 40 with a height greater than that of the plurality of micro projections 20 are formed. The fixing walls 40 prevent a phenomenon in which the microstructure disposed on the plurality of micro projections 20 slips due to the cleaning solution. Only, the fixing walls 40 may not only be formed as one overall the edge of the substrate 10 but also be formed of a predetermined number according to a certain regulation to fix the microstructure.

On the bottom of the substrate 10, the heating device 50 is provided. The heating device 50 may be not only separated from the apparatus but also directly attached to the apparatus to remove the cleaning solution. When the heating device 50 is attached to the substrate 10, the cleaning solution may be quickly and uniformly removed.

Figure 4:
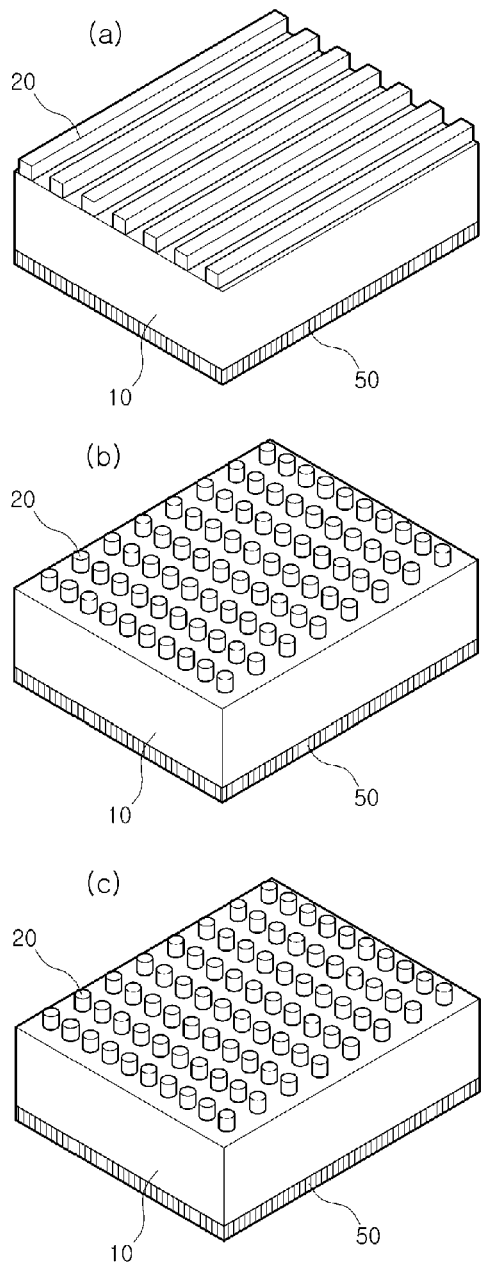
FIG. 4 is diagrams illustrating various shapes and structures of a plurality of micro projections according to an exemplary embodiment of the present invention.

FIG. 4 is diagram illustrating various shapes and structures of the plurality of micro projections 20.

The plurality of micro projections 20 may be formed in various shapes on the substrate 10 in case of forming the flow path 60 allowing the cleaning solution to flow and be discharged. For example, as shown in the drawings, the plurality of micro projections 20 may have various shapes such as a circle, a square, and a lattice. When formed in various shapes, a cross-section of the plurality of micro projections 20 may be smaller than the microstructure to be fully in contact with the microstructure and to easily remove the cleaning solution. For example, the cross-section may have a size of several to several tens microns. Also, the plurality of micro projections 20 may be formed at an interval of several to several tens microns to be fully in contact with the micro structure.

Figure 5:
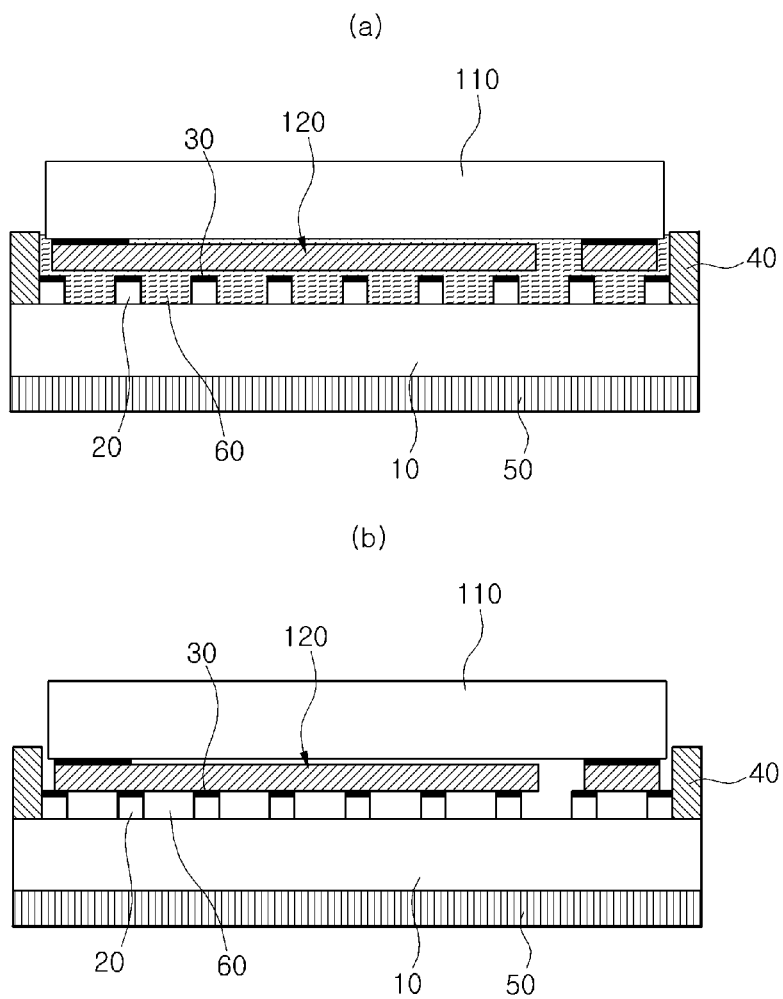
FIG. 5 is concept diagrams illustrating a theory of operation of the apparatus of FIG. 2.

FIG. 5 is concept diagrams illustrating a theory of operation of the apparatus of FIG. 2.

A sacrificial layer formed to float the microstructure 120 from the substrate 110 is removed using an etching solution and the etching solution is replaced by a cleaning solution. While the cleaning solution is present, the microstructure 120 is disposed upside down on the anti-stiction layer 30 of the apparatus. In this case, a floating gap between the microstructure 120 and the substrate 110 is filled with the cleaning solution.

When the microstructure 120 is disposed on the top of the plurality of micro projections 20, the fixing wall 40 fixes the microstructure 120 to prevent a slip of the microstructure 120. In this case, a temperature of the substrate 10 is fully increased using the heating device 50 in such a way that the cleaning solution is vaporized, thereby discharging the cleaning solution via the flow path 60 formed by the plurality of micro projections 20.

Via the process, while the microstructure 120 is in contact with the plurality of micro projections 20, surface tension occurring between the microstructure 120 and the substrate 110 when the cleaning solution is discharged from the floating gap is offset due to surface tension formed between the microstructure 120 and the plurality of micro projections 20. Accordingly, though the cleaning solution is perfectly removed, the microstructure 120 does not stick to the substrate 110 and is floated therefrom with a certain space. When the cleaning solution is perfectly removed by fully heating the substrate 10, the microstructure 120 and the substrate 110 are separated from the plurality of micro projections, thereby obtaining the microstructure 120 floated without stiction.

Figure 6:
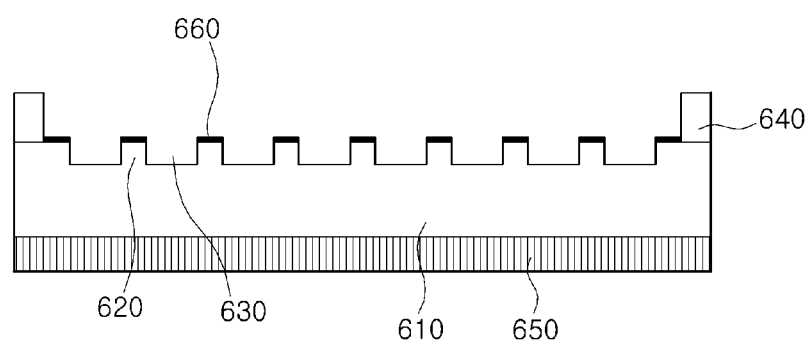
FIG. 6 is an apparatus for preventing stiction of a three-dimensional MEMS microstructure, according to another embodiment of the present invention.

FIG. 6 is a diagram illustrating an apparatus for preventing stiction of a three-dimensional MEMS microstructure, according to another embodiment of the present invention.

Referring to FIG. 6, the apparatus includes a substrate 610, one or more of fixing walls 640 for preventing a slip of the MEMS microstructure, and a heating device 650 disposed on a bottom of the substrate 610.

An anti-stiction layer 660 is formed on a top of the substrate 610. The anti-stiction layer 660 may be formed by vaporizing an anti-stiction material to prevent a phenomenon in which the microstructure sticks to the substrate 610. Also, unevenness may be formed to reduce a contact area between the microstructure and the substrate 610.

The substrate 610 has a top surface where a flow path 630 is formed at a certain depth to discharge a cleaning solution flowing from the microstructure disposed on the top surface of the substrate 610. The flow path 630 may be formed in various shapes that are capable of discharging the cleaning solution. That is, by the flow path 630, a plurality of micro projections may be formed, but not limited to, as shown in FIG. 3. The plurality of micro projections may be formed in various shape and patterns to discharge the cleaning solution.

The fixing walls 640 disposes at an edge of a top surface of the substrate 610 and prevents the slip of the microstructure. The fixing wall 640 may be formed in one body overall the edge. However, the number of the fixing walls 640 may be plural.

As another embodiment of the present invention, there is provided an apparatus for preventing stiction of a three-dimensional MEMS microstructure, the apparatus including a substrate where a flow path is formed with a certain depth to discharge a cleaning solution flowing from the microstructure and one or more fixing walls formed with a certain height on an edge of the substrate and preventing a slip of the microstructure.

While the present invention has been shown and described in connection with the exemplary embodiments, it will be apparent to those skilled in the art that modifications and variations can be made without departing from the spirit and scope of the invention as defined by the appended claims.

The invention claimed is:

1. An apparatus for preventing stiction of a three-dimensional MEMS (microelectromechanical system) microstructure, the apparatus comprising:
   a drying plate;
   a plurality of micro projections formed on a top surface of the drying plate, the plurality of micro projections having a predetermined height; and
   a flow path provided between the plurality of micro projections, the flow path being defined by the micro projections so that a cleaning solution flowing out from the microstructure disposed thereabove is discharged,
   wherein an anti-stiction material is provided on an uppermost surface of each of the micro projections, the anti-stiction material being vapor-deposited on the uppermost surface of each of the micro projections.

2. The apparatus of claim 1, wherein one or more of fixing walls formed higher than the plurality of micro projections to prevent a slip of the microstructure are formed on an edge of the drying plate.

3. The apparatus of claim 1, further comprising a heating device on a bottom of the drying plate.

4. The apparatus of claim 1, wherein the plurality of micro projections have an uneven top portion.

5. The apparatus of claim 1, wherein the plurality of micro projections are symmetrically formed in a shape where a certain pattern is repeated.

6. An apparatus for preventing stiction of a three-dimensional MEMS micro-structure, the apparatus comprising:
   a drying plate having an anti-stiction layer formed on a top surface thereof;
   a plurality of micro projections extending from the top surface of the drying plate, the anti-stiction layer being provided on a top surface of each of the plurality of micro projections;
   a flow path having a predetermined depth to discharge a cleaning solution flowing from the microstructure, the flow path being defined by the micro projections; and
   one or more fixing walls having a predetermined height, the one or more fixing walls being provided on an edge of the substrate to prevent a slip of the microstructure.

7. The apparatus of claim 6, wherein the anti-stiction layer is formed by vapor-depositing an anti-stiction material.

8. The apparatus of claim 6, wherein the flow path is formed in a shape where a certain pattern is repeated.

9. The apparatus of claim 6, further comprising a heating device on a bottom of the drying plate.

* * * * *